United States Patent
Antonellis et al.

(10) Patent No.: US 10,340,870 B2
(45) Date of Patent: Jul. 2, 2019

(54) TRANSFORMING AUDIO CONTENT FOR SUBJECTIVE FIDELITY

(71) Applicant: WARNER BROS. ENTERTAINMENT INC., Burbank, CA (US)

(72) Inventors: Darcy Antonellis, Granada Hills, CA (US); Lewis Ostover, Los Angeles, CA (US)

(73) Assignee: WARNER BROS. ENTERTAINMENT INC., Burbank, CA (US)

( * ) Notice: Subject to any disclaimer, the term of this patent is extended or adjusted under 35 U.S.C. 154(b) by 0 days.

(21) Appl. No.: 15/687,292

(22) Filed: Aug. 25, 2017

(65) Prior Publication Data

US 2018/0006622 A1 Jan. 4, 2018

Related U.S. Application Data

(63) Continuation of application No. 13/586,772, filed on Aug. 15, 2012, now Pat. No. 9,748,914.

(51) Int. Cl.
*H03G 5/00* (2006.01)
*H03G 5/16* (2006.01)
*H03G 9/00* (2006.01)

(52) U.S. Cl.
CPC ............ *H03G 5/005* (2013.01); *H03G 5/165* (2013.01); *H03G 9/005* (2013.01)

(58) Field of Classification Search
CPC ........ H03G 5/005; H03G 5/165; H03G 9/005; H04L 67/24; H04L 67/306; H04L 5/001; A61B 5/123; G10L 15/063
See application file for complete search history.

(56) References Cited

U.S. PATENT DOCUMENTS

| 7,181,297 B1 | 2/2007 | Pluvinage |
| 2003/0028385 A1 | 2/2003 | Christodoulou |

(Continued)

FOREIGN PATENT DOCUMENTS

| CN | 102421049 A | 4/2012 |
| JP | 2003510667 A | 3/2003 |
| JP | 2006510946 A | 3/2006 |
| JP | 2009532148 A | 9/2009 |
| WO | 2007078347 A1 | 7/2007 |
| WO | 2012090282 A1 | 7/2012 |

OTHER PUBLICATIONS

Japanese Office Action dated May 30, 2017 for Japanese Application No. 2015-527646.

(Continued)

*Primary Examiner* — Yogeshkumar Patel
(74) *Attorney, Agent, or Firm* — One LLP; Jonathan Jaech

(57) ABSTRACT

A method or apparatus for delivering audio programming such as music to listeners may include identifying, capturing and applying a listener's audiometric profile to transform audio content so that the listener hears the content similarly to how the content was originally heard by a creative producer of the content. An audio testing tool may be implemented as software application to identify and capture the listener's audiometric profile. A signal processor may operate an algorithm used for processing source audio content, obtaining an identity and an audiometric reference profile of the creative producer from metadata associated with the content. The signal processor may then provide audio output based on a difference between the listener's and creative producer's audiometric profiles.

25 Claims, 10 Drawing Sheets

(56) References Cited

U.S. PATENT DOCUMENTS

| | | | |
|---|---|---|---|
| 2005/0094822 A1* | 5/2005 | Swartz | A61B 5/121 381/56 |
| 2005/0198015 A1 | 9/2005 | Sezan et al. | |
| 2006/0080103 A1 | 4/2006 | Van Breemen | |
| 2006/0215844 A1 | 9/2006 | Voss | |
| 2008/0080722 A1 | 4/2008 | Carroll | |
| 2008/0275904 A1 | 11/2008 | Breebaart et al. | |
| 2008/0306807 A1 | 12/2008 | Amento et al. | |
| 2010/0191143 A1* | 7/2010 | Ganter | A61B 5/121 600/559 |
| 2011/0029111 A1 | 2/2011 | Sabin et al. | |
| 2012/0063616 A1 | 3/2012 | Walsh | |
| 2012/0089437 A1* | 4/2012 | Amento | G06Q 30/02 705/7.29 |
| 2012/0197604 A1 | 8/2012 | Badiey et al. | |
| 2013/0245798 A1* | 9/2013 | Kallai | H03G 5/165 700/94 |

OTHER PUBLICATIONS

English Translation of Japanese Office Action dated May 30, 2017 for Japanese Application No. 2015-527646.
English Translation of Japanese patent application No. JP2009532148A.
English Translation of Japanese patent application No. JP2003510667A.
English Translation of Japanese patent application No. JP2006510946A.
Chinese Office Action dated Dec. 22, 2016 for Chinese Application No. 201380042753.2.
English translation of Chinese Office Action dated Dec. 22, 2016 for Chinese Application No. 201380042753.2.
English translation of Chinese Application No. 102421049A published Apr. 18, 2012.
European extended Search Report dated Mar. 31, 2016 from related European application No. 13829561.3.
International Search Report dated Nov. 27, 2013 for application No. PCT/US2013/055217.

* cited by examiner

US 10,340,870 B2

TRANSFORMING AUDIO CONTENT FOR SUBJECTIVE FIDELITY

CROSS-REFERENCE TO RELATED APPLICATION

The present application is a continuation of U.S. patent application Ser. No. 13/586,772 filed Aug. 15, 2012, now U.S. Pat. No. 9,748,914, which application is incorporated herein in its entirety by reference.

FIELD

The present application relates generally to processing audio data using a computer, and more particularly to transforming audio content for subjective fidelity to an aural experience of the content producer or other person.

BACKGROUND

Analog and digital audio content is customarily originated, captured, stored, and delivered to consumers via analog and digital media of various types. For example, CDs, DVDs, BDs, magnetic tape, LP records, film prints, digital files and streams are used with various inherent limitations and benefits to deliver sufficient fidelity to be enjoyed by consumers. The benefits and drawbacks of many of the aforementioned origination, capture, storage and transmission media and means are well known.

Each listener brings a personal set of perceptual characteristics to his or her experience of hearing. Because of natural differences between each listener's hearing acuity and perceptual apparatus, individual listeners may experience audio content differently from the same content as it is experienced by another person, for example by the content producer. Natural frequency, dynamic, and time domain deviations may exist among different listeners, including between each ear among listeners. These naturally occurring differences may include differences in apparent sound intensity, pitch, thresholds such as 'the threshold of audibility' at different frequencies, and sensitivity to positional cues.

Creative producer mixes of popular music and movie/episodic soundtracks are available, each highlighting creative choices that may emphasize certain audio characteristics such as frequency response curves and balance, dynamics, or single channel, stereo or multichannel effects such as surround, echo, delay or other positional cues. However, physical characteristics of each listener's outer and inner ears, and each listener's perceptual biases, influence what each listener hears when listening to the same audio recording, even when using identical sound reproduction equipment in identical environments. Such differences may cause subtle impediments to communication between the producer and listener, by preventing the listener from subjectively perceiving what the creative producer intended.

The creative intent in presenting a particular audio recording—sometimes referred to as a "mix"—may include offering listeners a particular listening experience, for example a listening experience that includes a certain frequency balance, dynamics, and surround sound field. Although origination, capture, storage, and delivery systems for audio reproduction are often exactingly managed in an attempt to provide high fidelity to the source content, each listener's ears and perceptual biases may nonetheless influence their hearing experience in uncontrolled ways when listening to an audio recording using a player device. Thus, the subjective experience of listeners may not match the acoustic experience intended by the content producer, despite careful attention to high-fidelity reproduction in the audio player and listening environment.

These and other limitations of prior methods for processing audio content for high-fidelity may be overcome by the novel methods and apparatus disclosed herein.

SUMMARY

Methods, apparatus and systems for transforming audio content to achieve subjective fidelity are described in detail in the detailed description, and certain aspects are summarized below. This summary and the following detailed description should be interpreted as complementary parts of an integrated disclosure, which parts may include redundant subject matter and/or supplemental subject matter. An omission in either section does not indicate priority or relative importance of any element described in the integrated application. Differences between the sections may include supplemental disclosures of alternative embodiments, additional details, or alternative descriptions of identical embodiments using different terminology, as should be apparent from the respective disclosures.

Methods of delivering audio programming such as music to listeners may include identifying, capturing and applying a reference listener's (e.g. a content producer's) audio perception characteristics—sometimes referred to herein as the listener's Personal Waveform Profile (PWP)—to transform audio content so that another listener perceives the content similarly to how the content would be perceived by the reference listener, such as a content producer. In a sense, the audio signal may thus be custom-made for each listener, based on differences between a PWP measured or assumed for the listener, and a PWP measured or assumed for some other person such as the content producer.

Aspects of the method may include applying an audio testing tool and software application to identify and capture a creative producer's and each intended listener's respective, unique Personal Waveform Profiles. The method may further include operation of an algorithm processing a source audio content using respective listeners' Personal Waveform Profiles to provide audio output. The audio output is configured for causing a second listener to subjectively experience the audio output more like a subjective experience of a first listener of the source audio content. Accordingly, the subjective listening experience of an audience member can be made to better approximate that of any other person, for example of the audio creative producer, so that such a listener shares a similar listening experience to the other person.

In some embodiments, a digital signal processor coupled to an audio input and audio output may perform a method for processing an audio signal. The method may include receiving an audiometric reference profile, an audiometric listener profile; and an encoded input audio signal. The method may further include transforming the input audio signal using the signal processor into an output audio signal, based on a difference between the reference profile or the preferred listener's profile and the other listener profiles so that the output audio signal compensates for the difference. The transformation may be performed digitally on an encoded signal, generating an encoded output signal. In an alternative, the transformation may be performed using an amplifier and/or delay circuit operating on a decoded analog audio signal, under the control of a digital processor.

In some embodiments, transforming the input audio signal may include altering one or more frequencies of the input audio signal in proportion to the difference at corresponding one or more frequencies of the reference and listener profiles. The method may further include generating the audiometric reference profile based on audiometric test results for a first person, and generating the audiometric listener profile based on audiometric test results for a second person. In such case, transforming the input audio signal may further include generating the output signal by boosting the input signal at one or more frequencies where the difference indicates that the first person is more sensitive to sound than the second person and attenuating the input signal at one or more frequencies where the difference indicates that the first person is less sensitive to sound than the second person. Boosting the input signal may include, for example, increasing the amplitude of the signal over a defined frequency band portion of an audio spectrum. Likewise, attenuating the input signal may include, for example, decreasing the amplitude of the signal over a defined frequency band portion of an audio spectrum.

In an aspect, the encoded input audio signal may be indicated as having been edited by the first person. For example, the first person may be a creative producer of an audio track or program from which the audio signal is obtained. An audio player may provide an indication of the producer so that the listener can appreciate the basis for the transformation of the audio signal. The output audio signal may be configured such that, when played by an audio player device and listened to by a second person, a listening experience of the second person becomes more like a listening experience for the first person, for sound generated from the output audio signal. When the first person is the content producer, the second person (e.g., audio consumer) may experience the audio content more as experienced and intended by the producer.

In other aspects, generating the audiometric listener profile may be based on audiometric data for a sample of a general population, so that the audiometric listener profile represents an aggregate measure for a group of listeners. For example, aggregate (e.g., average or median) audiometric profiles may be developed for different genders and age ranges. These average profiles may be used to approximate a listener profile when personal audiometric data is not available.

In addition to compensating for differences in sensitivity at different frequencies, the method may also be used to compensate for differences in times required for hearing response. Because of differences in the ear canal and other physical structures of the ear, individuals may perceive sounds at slightly different times. Such differences may cause differences in perceiving positional cues or dynamic effects. To compensate for these differences, transforming the input audio signal may include altering a phase of the audio signal at one or more times of the input audio signal in proportion to the difference at corresponding one or more times of the reference and listener profiles. For example, altering the phase may be performed for a defined sub-band of the audio signal to change a time at which a sound encoded by the audio signal occurs. The time-shifting may change the times at which sounds of different channels (for example, right or left channels), or bands of frequencies in said channels, occur relative to one another.

In related aspects, an audio processing apparatus may be provided for performing any of the methods and aspects of the methods summarized above. An apparatus may include, for example, a processor coupled to a memory, wherein the memory holds instructions for execution by the processor to cause the apparatus to perform operations as described above, an audio input coupled to the processor for providing a source audio signal, and an audio output coupled to the processor for outputting a transformed audio signal. Certain aspects of such apparatus (e.g., hardware aspects) may be exemplified by equipment such as media players, mp3 players, computer servers, personal computers, network-enabled televisions, set-top boxes, smart phones, notepad or tablet computers, laptop computers, and other computing devices of various types used for accessing audio content. Similarly, an article of manufacture may be provided, including a non-transitory computer-readable medium holding encoded instructions, which when executed by a processor, may cause a computing apparatus adapted for audio signal processing to perform the methods and aspects of the methods as summarized above.

Further embodiments, aspects and details of methods, apparatus and systems for transforming audio content for subjective fidelity are presented in the detailed description that follows.

BRIEF DESCRIPTION OF THE DRAWINGS

The present technology, in accordance with one or more various embodiments, is described in detail with reference to the following figures. The drawings are provided for purposes of illustration only and merely depict typical or example embodiments of the technology. Like element numerals may be used to indicate like elements appearing in one or more of the figures.

DETAILED DESCRIPTION

Figure 1:
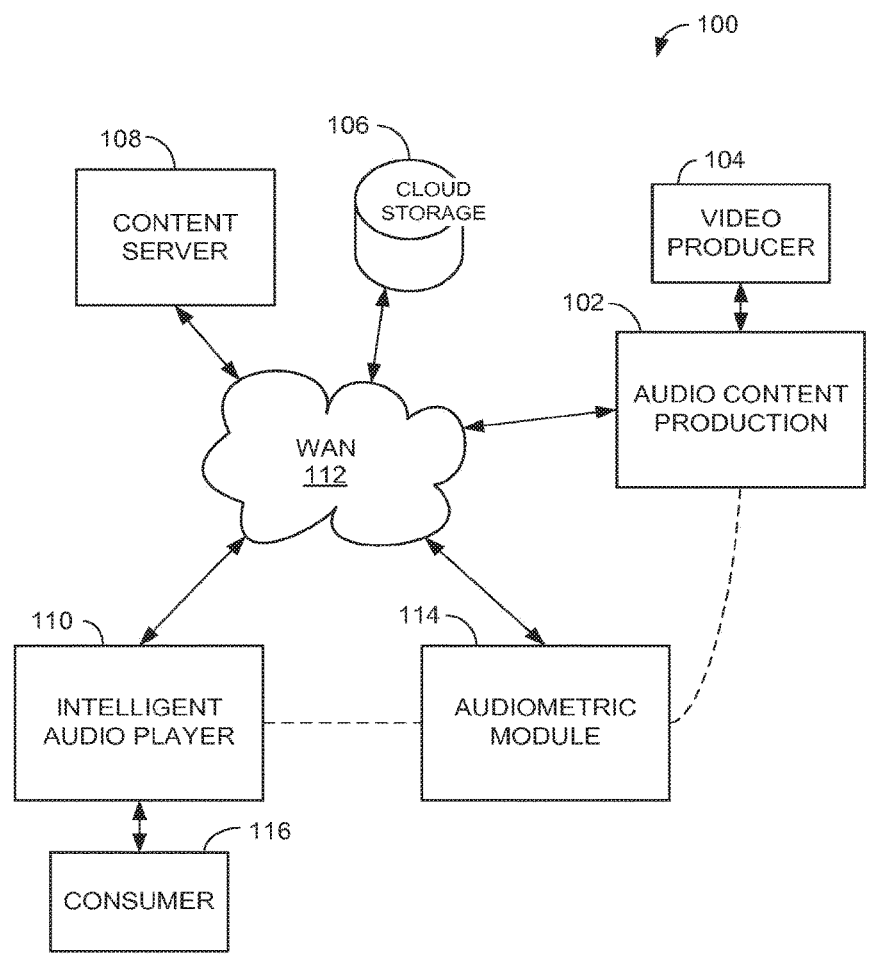
FIG. 1 is a schematic diagram illustrating an embodiment of a system that may be used to perform methods as described herein.

In the following description, for purposes of explanation, numerous specific details are set forth in order to provide a thorough understanding of one or more embodiments. It may be evident, however, that such embodiments may be practiced without these specific details. In other instances, well-known structures and devices are shown in block diagram form in order to facilitate describing one or more embodiments.

Contrary to known methods for audio processing, the present technology does not correct audio to make it flat or substantially distortion free in frequency, dynamics, and time domains, nor does it correct for multiple listeners (i.e. at multiple listener positions within a room) using some form of general response filtering. Instead, the present technology may be used to deliberately distort or otherwise contour an audio signal to compensate for natural differences among different listeners' hearing capabilities. The audio may be contoured in accordance with a previously determined Personal Waveform Profile so that a creative producer's mix, contoured according to his/her Personal Waveform Profile, can be enjoyed by others.

This audio processing can be used to more widely share a particular experience of the audio content in a manner that is consistent with the creative producer's original and personal experience of the audio content. Either the creative producer's PWP can be used to transform other content for other listeners with reference to a default or assumed PWP, or the creative producer's PWP can be used to manipulate, effectively to replace, the downstream listener's PWP.

In an aspect of the technology, some of the basic and influential characteristics of each listener's hearing response acuity and perceptual characteristics or biases, e.g. the hearing and audio perception characteristics of a creative audio producer, are characterized by identifying and capturing each listener's PWP in a consistent, interactive manner in the form of parameters. For example, an interactive, audiometric-like application may be executed on a personal computer, smartphone, tablet, or notepad computer. The application may generate audiometric tones that can be heard through headphones or ear buds, with testing protocol managed through a visual user interface. Each listener's different hearing response biases or deviations from norms can be identified and recorded as a set of audiometric test data or hearing parameters. Examples of the basic and influential characteristics of each listener's hearing and perceptual biases that can be identified and captured as parameters may include, for example, audiometric deviations from the norm in frequency response acuity, frequency response acuity in relation to different volume levels—i.e. a loudness curve, overall balance—i.e. frequency response tilt, and sensitivities with respect to positioning cues.

In other aspects, an algorithm may be used to abstract from the interactive, audiometric-style testing application and translate the PWP parameters into an audiogram or other representation that can be used as a signal transform function, or to drive software that transforms audio content. For example, a PWP of a creative producer may be plotted as an audiogram compared to reference value or values and then used as the standard against which others' measured audiometric parameter PWPs can be compared and transformed, for example, by boosting or attenuating the audio frequency, or time-shifting, at selected frequencies and/or channels. For listeners other than the preferred creative producer, source material that has been recorded by the creative producer who has certain measured hearing characteristics may be 'normalized' or otherwise transformed—using equalization and filtering techniques for example—to restore or otherwise emphasize/de-emphasize the frequency response, dynamics, positioning cues and other relevant characteristics that govern the creative producer's hearing perception, even though other listeners' hearing characteristics as represented by audiometric parameters are different from the creative producer.

In other aspects, a system of distributed and host computing resources may be used to store and make accessible the captured PWP transforms, for example, storing and providing access to stored data via cloud storage. This data can later be selected and applied to audio content to transform it in ways consistent with the biases captured in the PWPs. One person's PWP can be swapped out for another's, for example by selective frequency emphasis/de-emphasis, frequency-sensitivity at different volume balancing, and positioning cue emphasis/de-emphasis, based on differences between PWP parameters.

In one mode, a creative producer's PWP transform can be applied to any content, not just content already mixed by this creative producer. In another mode, the creative producer's PWP transform can be compared to a second, different listener's PWP so that the downstream listener's PWP transform can be normalized using reverse transform parameters that better convey the audio characteristics of the creative producer's PWP transform so that the desired audio characteristics are boosted or attenuated in light of the preferred, creative producer's PWP transform vs. the downstream listener's. For example, filtering or other PWP-related emphasis/de-emphasis may restore certain frequencies, bands of frequencies, dynamics, or balance characteristics that are intended by the creative producer but are not perceived with the intended fidelity by the downstream listener. In another mode the PWP first or second modes can be switched off, e.g. for comparison purposes.

There are different environments in which PWP transform characteristics can be identified and captured using the aforementioned interactive, audiometric-style testing. For example, testing may be performed in the ear canal via ear-bud testing, on the ear or over the ear using headphones, or in spaces such as rooms or open areas using loudspeakers. Different layers of interpretation may be involved in these cases, because rooms and headphones 'load' the sound reproduced by an audio system (e.g. conventional speakers or headphones) in manners differently from how the ear canal influences sound delivered via ear-buds.

Likewise, there are different environments in which audio content may be enjoyed, for example via headphones or ear-buds, or in rooms or open space using loudspeakers. In addition, the ability or inability of different sound reproduction systems to reproduce some frequencies, bands of frequencies, dynamics, and positioning cues varies according to the specifics of the equipment and these environments.

To account for such differences, different modes of application testing to develop PWPs may be developed depending upon whether the audiometric testing or listening environments are, respectively, an in-ear ear bud, over-ear or on-ear headphone, or other 'enclosure' environment. Such variations in playback environment may be taken into account when applying the PWP transforms.

An interactive application for audiometric testing may be developed with a different and more entertaining user interface than standard audiometry testing. For example, an interface may be configured to enable a user to choose what is 'more or less pleasing' using content that highlights certain frequency, frequency band, dynamics, and positioning cue material to identify and capture the relevant parameters of a PWP.

The additive and/or subtractive audio characteristics of a PWP transform applied to content or substituted for another PWP transform thereby alters audio content with the result that one person can hear and perceive audio content more like another person. For example, a consumer can hear more like the creative producer heard and intended, in spite of the two listener's different inner/outer ear and perception biases.

Features and aspects as disclosed herein may be implemented within a system 100 as shown in FIG. 1, or in any other system capable of obtaining audiometric data for listeners or groups of listeners, obtaining resource source audio content, processing the audio content to obtain transformed content, and providing audio output from the transformed content. The system 100 may include certain signaling and processing components in communication via a Wide Area Network (WAN) 112, or in any other suitable manner. For example, the components may communicate by one or more of an internal bus, a wireless network, a local area network, or other communication network or line.

System 100 may include a component 102 for audio content production, which may be operated by a video producer 104 who may have personal hearing and perceptive characteristics that can be measured using an audiometric module 114. The audio content production module 102 may therefore coordinate with the audiometric module 114 to obtain an PWP or other audiometric profile through a testing process with the video producer 104, or by retrieving a previously obtained PWP or other profile from a data store, for example from cloud storage 106. The audio content production module 102 may comprise any suitable audio mixing and editing equipment as known in the art of audio production, and may include both digital and analog components. Once a particular audio content is produced and released, the content may be provided in digital form (e.g., in an mp3 or other audio format) to a content server 108, which may arrange for storage of the audio content in any suitable non-transitory computer-readable medium, for example in cloud storage component 106, or other tangible medium.

The content server 108 may be configured as a computer server in communication with the WAN 112. The server 108 may manage storage and retrieval of audio content and PWPs or other audiometric data from the cloud storage 106. It should be appreciated that the server 108 and cloud storage are an example of one suitable mode for storing and distributing data, but other modes may also be suitable. For example, audio content and PWP data may be stored and distributed on a portable medium, for example on an optical disc or memory device.

The system 100 may include an intelligent audio player 110, which may be configured as a special-purpose audio player, or special-purpose module of a more general-purpose machine, by dedicated hardware and/or software. The audio player may also play video synchronized to an audio stream. The intelligent audio player 110 may be embodied, for example, in a personal computer, smart phone, notebook computer, notepad computer, tablet computer, smart television, or other component. The player 110 may communicate with the WAN 112 via a wired and/or wireless interface. The player 110 may be operated by an audio consumer 116 having personal hearing and perceptive characteristics that can be measured using the audiometric module 114, or similar module.

The audiometric module 114 may be included as a component of the intelligent audio player 110, or may be configured as a stand-alone component in separate hardware. In the alternative, a first portion of the audiometric module 114 may be implemented in the audio player 110, a second portion in a separate hardware component, and the first and second portions may coordinate with one another via the WAN 112 or other connection to perform an audiometric testing process.

Figure 2:
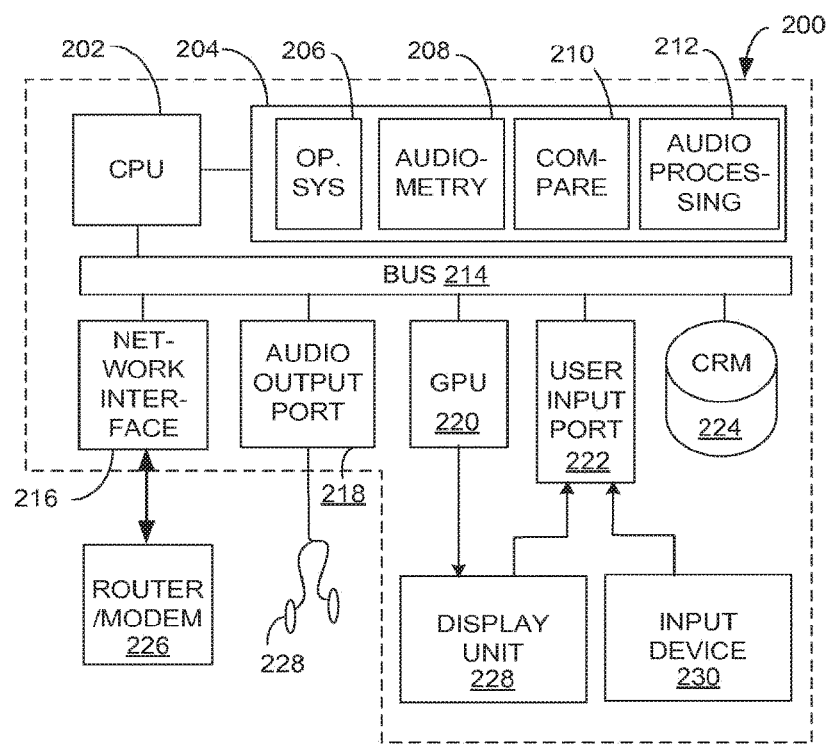
FIG. 2 is a schematic block diagram illustrating an embodiment of an audio player for supporting and executing the methods described herein.

Referring to FIG. 2, a diagrammatic view of an example intelligent audio player 200 is illustrated. The audio player 200 may be, or may include, a computer. In selected embodiments, the computer 200 may include a processor 202 operatively coupled to a processor memory 204, which holds binary-coded functional modules for execution by the processor 202. Such functional modules may include an operating system 206 for handling system functions such as input/output and memory access, an audiometry module 208 for performing audiometric testing via a user interface, e.g., display unit 228 and audio output port 218, a comparison module for processing a PWP from the audiometry module 208 with a reference PWP, and an audio processing module 212 for transforming input audio content based on a comparison of the user PWP (or selected average group PWP) to a reference PWP from the audio producer or other standard.

A bus 214 or other communication component may support communication of information within the computer 200. The processor 202 may be a specialized or dedicated microprocessor configured to perform particular tasks in accordance with the features and aspects disclosed herein by executing machine-readable software code defining the particular tasks. Processor memory 204 (e.g., random access memory (RAM) or other dynamic storage device) may be connected to the bus 214 or directly to the processor 202, and store information and instructions to be executed by a processor 202. The memory 204 may also store temporary variables or other intermediate information during execution of such instructions.

A computer-readable medium in a storage device 224 may be connected to the bus 214 and store static information and instructions for the processor 202; for example, the storage device 224 may store the modules 206, 208, 210 and 212 when the audio player 200 is powered off, from which the modules may be loaded into the processor memory 204 when the client 200 is powered up. The storage device 224 may include a non-transitory computer-readable medium holding information, instructions, or some combination thereof, for example instructions that when executed by the processor 202, cause the audio player 200 to perform one or more operations of a method as described herein.

A communication interface 216 may also be connected to the bus 214. The communication interface 216 may provide or support two-way data communication between the audio player 200 and one or more external devices, e.g., the content server 108, optionally via a router/modem 226 and a wired or wireless connection (not shown). In addition, the audio player 200 may include an audio output port 218 for driving a suitable audio receiver/speaker system for generating audible output to the user, for example ear buds 228, external headphones, external or stereo/surround sound system. It should be appreciate that high-quality internal earbuds inserted into the ear canal may be advantageous for eliminating environmental or anatomical differences present when external headphones or speaker are used. Therefore more consistent and predictable results may be achieved by using ear buds instead of external systems for audiometric testing and content listening.

The audio player 200 may be connected (e.g., via the bus 214 and graphics processing unit 220) to a display unit 228. A display 228 may include any suitable configuration for displaying information to a user of the audio player 200. For example, a display 228 may include or utilize a liquid crystal display (LCD), touchscreen LCD (e.g., capacitive display), light emitting diode (LED) display, projector, or other display device to present information to a user of the audio player 200 in a visual display.

One or more input devices 230 (e.g., an alphanumeric keyboard, microphone, keypad, remote controller, game controller, camera or camera array) may be connected to the bus 214 via a user input port 222 to communicate information and commands to the client 200. In selected embodiments, an input device 230 may provide or support control over the positioning of a cursor. Such a cursor control device, also called a pointing device, may be configured as a mouse, a trackball, a track pad, touch screen, cursor direction keys or other device for receiving or tracking physical movement and translating the movement into electrical signals indicating cursor movement. The cursor control device may be incorporated into the display unit 228, for example using a touch sensitive screen. A cursor control device may communicate direction information and command selections to the processor 202 and control cursor movement on the display 228. A cursor control device may have two or more degrees of freedom, for example allowing the device to specify cursor positions or other pointing/selection information in a plane or three-dimensional space.

The audio player 200 may be used to receive, process and output one or more source audio contents and associated audiometric reference profiles. In selected embodiments, such receiving, processing and outputting may be in response to the processor 202 executing one or more sequences of one or more instructions contained in main memory 204. Such instructions may be read into main memory 204 from another non-transitory computer-readable medium (e.g., a storage device 224).

Execution of sequences of instructions contained in main memory 204 may cause a processor 202 to perform one or more of the procedures or steps described herein. In selected embodiments, one or more processors 202 in a multi-processing arrangement may also be employed to execute sequences of instructions contained in main memory 204. Alternatively, or in addition thereto, firmware may be used in place of, or in combination with, software instructions to implement procedures or steps in accordance with the features and aspects disclosed herein. Embodiments in accordance with the features and aspects disclosed herein are not limited to any specific combination of hardware circuitry and software.

Figure 3:
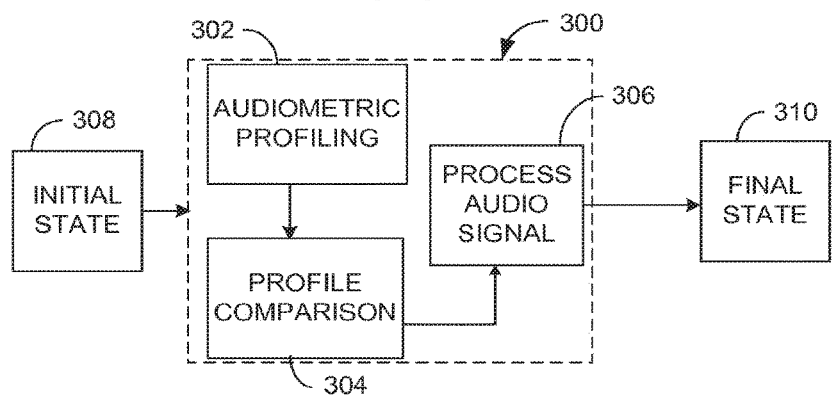
FIG. 3 is a state diagram illustrating general aspects of transforming audio content for subjective fidelity.

Referring to FIG. 3, general aspects of an audio signal alteration process 300 based on a difference between audiometric profiles of different listeners or groups of listeners are illustrated. The initial state 308 represents a source audio content as configured by a creative producer. The initial state 308 may be represented in a computer memory in various ways, for example by a digital audio file, for example a file formatted in a mp3, AIFF, way, wma, or other format. It should be apparent that the initial state 308 may be defined by data that represents, among other things, physical audio output from a transducer such as a speaker or earphone over a period of time. As such, initial state data represents a specific pattern of changes in a physical state (e.g., specific sounds) that was previously achieved or could have resulted when the input digital audio file was played by an audio player.

The audio transformation process 300 is (or includes) an input-output computation process performed by a computer processor, which operates on the initial state 308 to output a final state 310. The final state 310 likewise represents physical audio output from a transducer such as a speaker or earphone. The audio transformation process 300 may therefore operate as a state machine that accepts the initial state 308 and user input via an input device as inputs, and transforms the state data representing a physical pattern of sound produced by an audio output device into the final state 310. Subsequently, the final output state is realized in physical output from an audio player, the output including output of a dynamic audio field that is customized based on the PWP of a defined listener, to enable a subjective perception approaching that of a real or hypothetical person defined by a reference PWP.

The audio transformation process 300 may include several interactive modules, for example, an audiometric profiling module 302, a profile comparing or processing module 304 and an audio signal processing module 306. The module 300 may include other modules, for example, an audio content server module, audio driver module, graphics module, etc., which for illustrative simplicity are not shown. The audiometric profiling module 302 may obtain and manage audiometric test data and related parameters, for example PWPs. The profile comparing or processing module 304 may process two or more distinct PWPs or other audiometric profiles to determine a difference that can be used for transforming an audio file. The audio processing module 306 may determine the final state based on input from the profile comparing or processing module 304.

Figure 4:
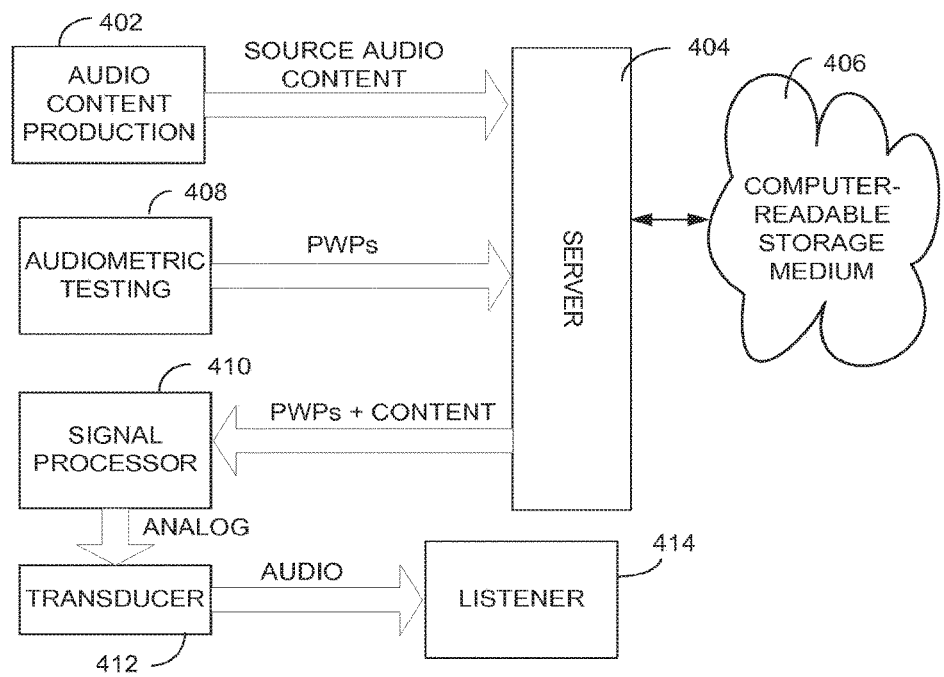
FIG. 4 is a block diagram illustrating data flows and processes for transforming audio content for subjective fidelity.

FIG. 4 is a block diagram illustrating an example of data flows and processing blocks for transforming audio content for subjective fidelity. An audio content production process 402 may output source audio content to a server 404, which may store the source audio content on a computer-readable storage medium 406, e.g., magnetic or optical storage medium. An audiometric testing process 408 may develop respective PWPs for a reference person (e.g., content producer) or group of reference persons, and a listener (e.g. consumer) or aggregate profile for a group of listeners. The server 404 may identify the PWP for the reference person or group as a standard for the source audio content, for example by relating identifiers for corresponding data records using a database or table. The audiometric testing process may output the PWPs to the server 404 for storage in the storage medium 406. Subsequently, an audio player device may transmit a request (not shown) for the source audio content to the server 404. The request may include an identifier for the source audio content and for a listener identified as originating the request via the audio player.

In response to such a request, the server 404 may retrieve the source audio content, the PWP for the reference person or group, based on a record associating the content and the reference PWP. The server 404 may also retrieve a PWP for the listener, and provide the PWPs and audio content as data objects to the signal processor 410. In the alternative, the PWP for the reference person or listener may be provided at an earlier or later time than the audio content; or if the audio player has generated the listener PWP locally, the listener PWP may be retrieved instead from a local memory. The signal processor 410 processes the audio content based on the different PWPs for the reference person and listener to produce an altered or transformed audio content. The signal processor 410 may be implemented as a module of a client audio player device, or as a remote process on a separate machine. The processor 410 provides the transformed audio content to an audio transducer 412, for example ear buds, headphones or speakers, of an audio player. In turn, the transducer outputs audio to the listener 414 generated from the transformed audio content by an audio driver.

Figure 5:
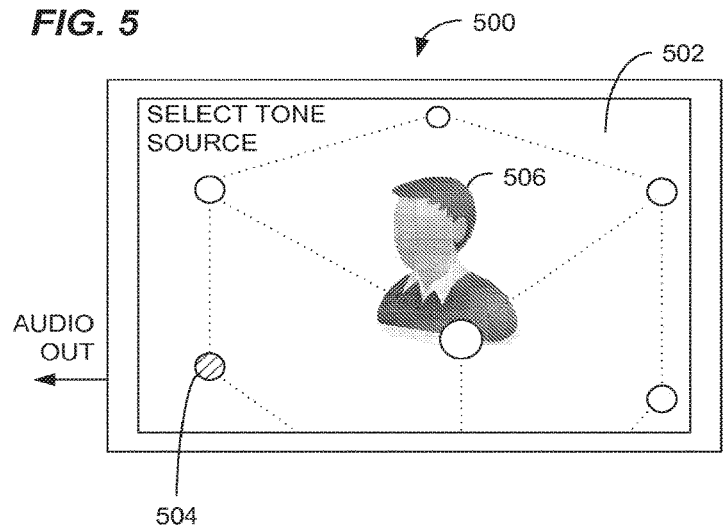
FIG. 5 is a simplified screen shot illustrating an example of a graphical user interface for audiometric testing of positional cue sensitivity.

The audiometric testing module 408 may be implemented on an audio player or server as a user-friendly application having a graphical user interface for operating an audiometric test protocol. For example, FIG. 5 shows an example of a screen shot on an audio player 500 that includes a touch-sensitive display screen 502. The touch-sensitive display screen may be used to guide the user during application of an audiometric test. By connecting the player's 500 audio out port to a set of ear buds (internal ear phones) or external headphone, or less preferably, to an audio receiver driving a set of speakers, and following audible and graphical instructions generated by an audiometric measuring program operating on the player 500, the user may administer an audiometric test to herself. Such an audiometric testing module may be an application made available via an associated audio device's 'app store,' for example available for an iPod™ or iPad™ via the Apple™ App Store™.

In more conventional frequency sensitivity testing, the audiometric application may generate a set of tones at various frequencies and power levels. By touching the screen, the user provides feedback whenever a tone is heard, and the player can thereby determine the threshold of hearing at each frequency. Optionally, the program may maintain and display a score or progress indicator to make the testing process more engaging. In other testing, the audiometric application may test dynamic effects and sensitivity to positional cues. FIG. 5 shows an example of a screen 502 for testing sensitivity to positional cues. The audiometric tester may generate a sequence of sounds with a various levels of positional cues. The user listens until able to distinguish an apparent 3D origin of the sound, for example by selecting a 3D location node 504 from a plurality of nodes positioned around a person icon 506 representing a relative position of the listener. Thus, the player can determine a listener's sensitivity to positional cues in the audio content. Other hearing perception tests may also be administered by the player 500, for example differences in time sensitivity between the right and left ear.

Figure 6A:
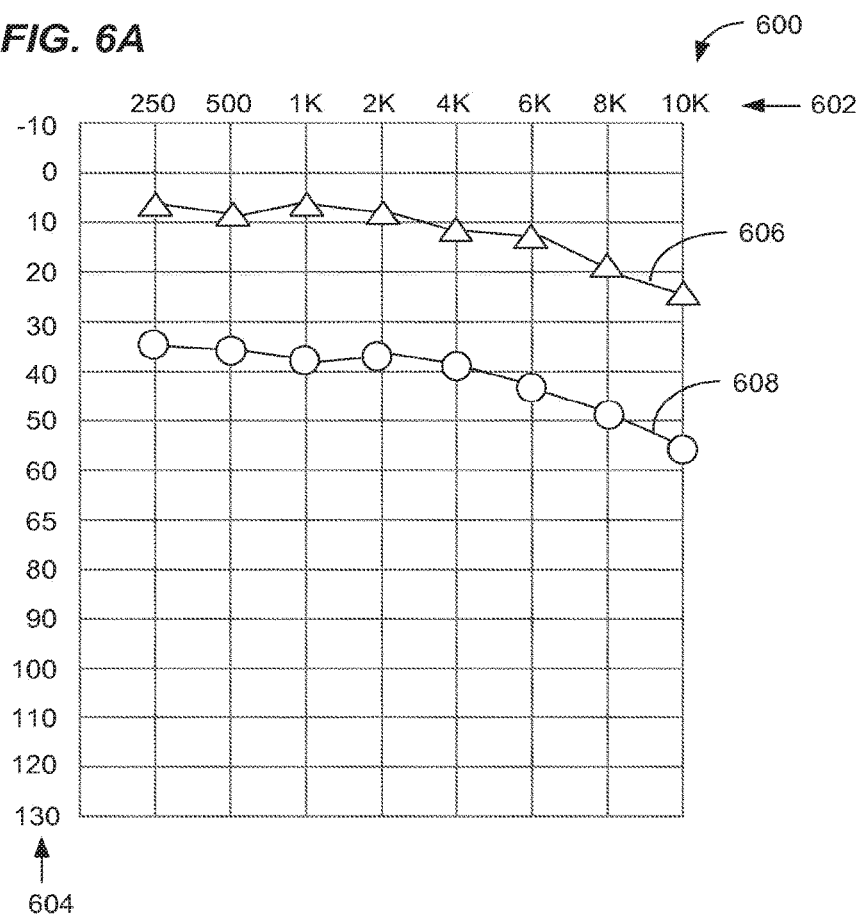
FIG. 6A is an example of an audiogram illustrating hearing sensitivity at different frequencies.

Frequency sensitivity data may conventionally be represented as a frequency response table 600, as shown in FIG. 6A. Threshold sensitivity is represented in decibels on the vertical scale 604 and selected test frequencies in Hertz (Hz) on the horizontal scale 602. In the illustrated example, the upper curve 606 represents a first (e.g., right) ear and the lower curve 608 may represent a less sensitive second (e.g., left) ear for a particular listener. Data representing the curves 606 and 608 may be encoded in any suitable numerical format (e.g., as a number sequence) and stored as part of a listener's PWP.

Figure 6B:
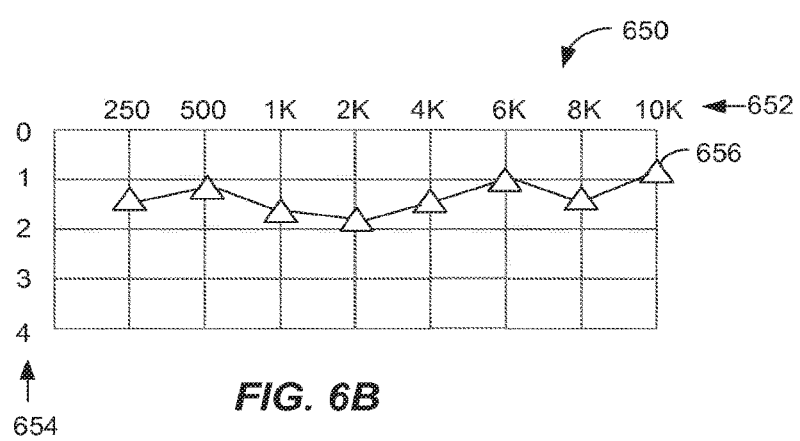
FIG. 6B is an example of an audiogram illustrating perception time lag at different frequencies.

FIG. 6B shows a non-conventional audiogram 650, merely as an example of non-conventional test data that may be included in a PWP. The audiogram includes time (e.g., milliseconds or tens of milliseconds) on the vertical axis 654 and selected test frequencies in Hertz on the horizontal scale 652. The curve 656 represents, for example, a difference in time sensitivity between the right and left ears of the listener. For further example, at 250 Hz, the curve indicates that the right ear hears a tone about 1.4 time units before the left ear. Such differences may be important in perceiving positional cues or other dynamic effects. The curve 656 may be encoded in any suitable format and stored as a second part of a listener PWP.

Figure 7A:
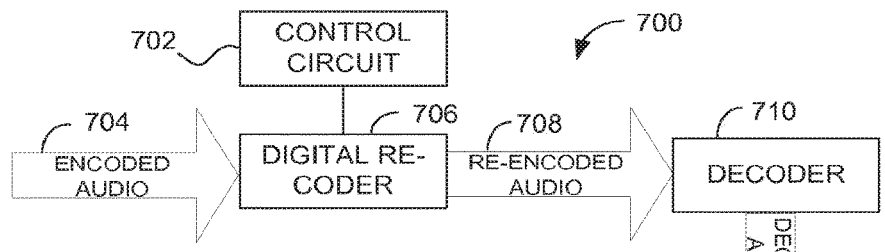
FIG. 7A-B are block diagrams illustrating aspects of a signal processor and process for altering an audio signal based on PWP differences, in alternative embodiments.

FIG. 7A illustrates aspects of a signal processor and process 700 for altering an audio signal based on PWP differences, wherein an encoded audio signal is re-coded to produce another digital signal in the same format, transformed to compensate for the difference between a reference PWP and a listener PWP. It should be appreciated that a generic or aggregate listener PWP may be substituted for a PWP determined for a particular listener, if a particular listener PWP is not available. Digital encoded data 704 is input to a digital re-coding process 706 controlled by a control circuit 702 including a processor and algorithm for re-coding. Re-coding may include boosting gain as a function of frequency, in proportion to a difference between the reference and listener profile, and/or phase/time shifting. The re-encoded audio data 708 may be decoded by a decoder 710 in a conventional fashion, producing decoded digital audio data 712. The decoded data may be provided to a digital-to-analog converter 714, which processes the digital data, preparing an analog audio signal 716. The analog audio signal 716 may be provided to an amplifier 718, which amplifies the signal and provides the amplified analog signal 720 to an audio transducer 722. The audio transducer 722 produces sound 724 which may be heard by a listener 726.

Figure 7B:
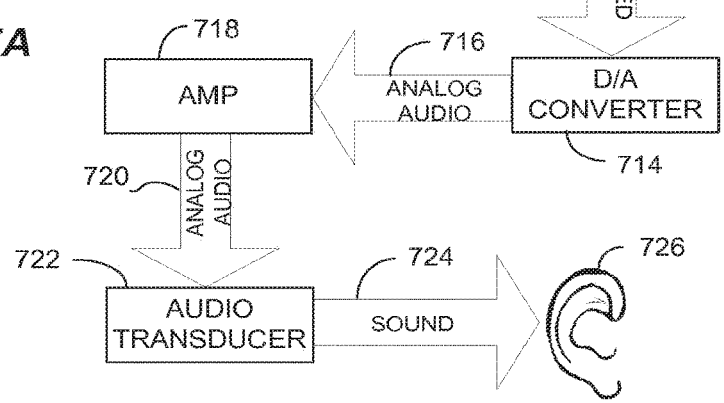
Figure 7B:
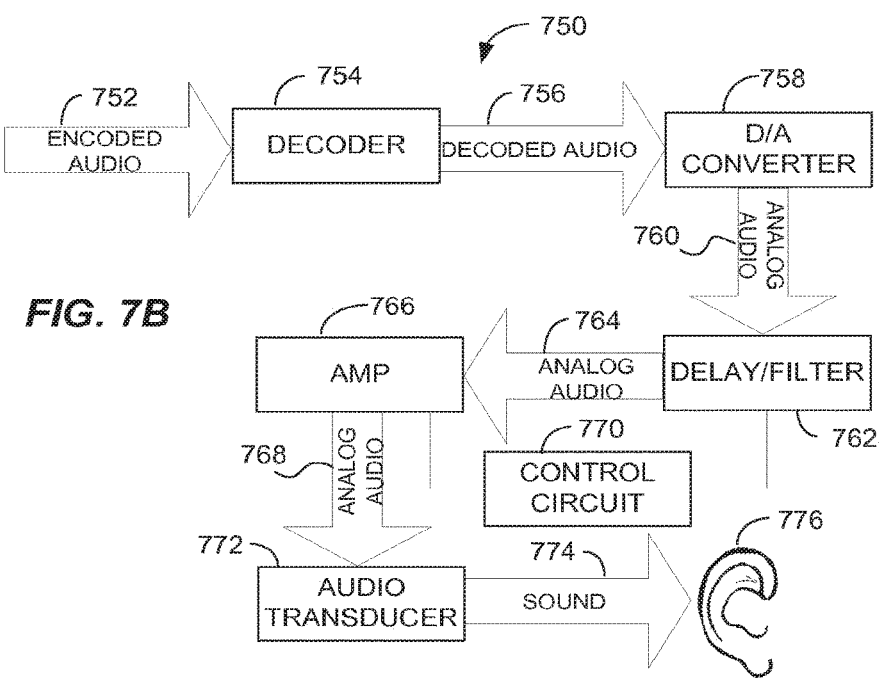

FIG. 7B illustrates aspects of a signal processor and process 750 for altering an audio signal based on PWP differences, wherein an encoded audio signal is first decoded and converted to analog form, and the analog signal is transformed (adjusted) based on a difference between a reference PWP and a listener PWP. Original encoded audio data 752 may be provided to a decoder 754 that prepares a decoded audio signal 756 in a conventional fashion. The decoded audio signal 756 may be provided to a digital-to-analog converter 758 that produces an analog audio signal 760.

Optionally, the analog audio signal 760 may be provided to a channel delay/filter module 762. Under control of a control circuit 770 including a processor operating a control algorithm, the delay/filter module 762 may delay separate channels (e.g., right and left channels) in proportion to a time sensitivity difference defined by the reference and listener PWP profiles. For example, if the comparing the PWPs for a right channel shows that the reference person responds more quickly than the listener in the right ear that the left ear, the delay/filter module 762 may delay the left channel to compensate. For further example, the delay/filter module may delay the left channel by an amount in proportion to the difference, allowing the slower right ear of the listener to "catch up" to the perception in the left ear. Such differences may, among other things, affect individual perception of positional cues.

In the alternative, or in addition, the delay/filter module 762 and control circuit 770 may filter the decoded audio signal 760 using a filter derived from a PWP, or portion of a PWP. For example, a PWP may include a Head-Related Transfer Function (HRTF). HRTFs are known in the art, and may be understood as a set of functions that describe reflection and diffraction effects on sound caused by the outer ear (the pinna). Reflection and diffraction of sound caused by the pinna, alone or in combination with the structure of the inner ear, may play an important role in localizing sound, i.e., perception of a location from where the sound originates. Therefore, filtering using an HRTF may be used to change the listener's perception of sound origin in a three-dimensional (3D) space. To the extent the HRTF is included in the reference and listener's respective PWPs, the module 762 may filter the audio signal 760 so that positional cues as perceived by the listener will more closely match those experienced by the reference person. HRTF filtering may compensate for differences between pinna/inner ear geometries of different individuals. For further example, where an in-the-ear transducer (e.g. earbud or cochlear implant) is being used only by the listener and not by the reference person, HRTF filtering may be used to compensate for the absence of the pinna in the audio path of the listener. It should be appreciated that the HRTF or other filtering may, in an alternative, be applied using digital processing as illustrated at module 706 of FIG. 7A.

HRTF may differ significantly between different individuals, and accurate measurement of HRTF may require a more rigorous and tedious testing process than individuals will generally tolerate. Therefore, an audio signal transformation process such as the processes 700 or 750 may enable a user to select a generic HRTF based on some external marker, for example a size and shape of the pinna. In an alternative, or in addition, the system may select an assumed HRTF, based on user feedback from a positional cue testing process. For example, using a user interface as shown in FIG. 5 to obtain information about a user's positional sense for defined audio signals, the system may correlate the user to one of several assumed HRTFs, or generate an assumed HRTF using an algorithm.

In addition, the analog audio signal 764 may be provided to an amplifier 766 under the control of the control circuit 770. The amplifier 766 may boost or attenuate gain of the analog signal 764 to compensate for frequency sensitivity differences between the PWPs, under control of the circuit 770. The amplifier may provide the amplified audio signal 768 to an audio transducer 772, which produces a sound 774 for the listener 776. FIGS. 7A and 7B are merely by way of illustration, and should not be understood as limiting adjustment of a digital or analog signal to the particular illustrated modes or modules.

Thus, embodiments of the present technology may include gathering of Personal Waveform Profiles of listeners via an interactive, audiometric-like testing application that identifies and captures listeners' relevant audio perception characteristics in a consistent manner as parameters, and then memorializes these parameters as a transform, e.g. a set of filters or other emphasis/de-emphasis functions that can be applied to audio content using an algorithm. In this manner, a user's PWP transform can be applied to audio content or substituted for another's PWP before audio content is presented to the listener. So, audio content that was developed, mixed or otherwise contoured as heard by the creative producer—whose PWP transform can be accessed as mentioned above—can be transformed to sound more like the producer intended it to be heard, by using the creative producer's PWP to transform the content in ways that mitigate effects of the subsequent listener's different PWP.

Audio Processing Operations and Apparatus

The foregoing examples may be embodied in one or more methodologies performed by a computer, for example an audio player, server, or some combination of an audio player and server. Methodologies that may be implemented in accordance with the disclosed subject matter will be better appreciated with reference to various flow charts. Although methodologies are shown and described as a series of acts/blocks for simplicity of illustration, it is to be understood and appreciated that the claimed subject matter is not limited by the number or order of blocks, as some blocks may occur in different orders and/or at substantially the same time with other blocks from what is depicted and described herein. Moreover, not all illustrated blocks may be required to implement methodologies described herein. It is to be appreciated that functionality associated with blocks may be implemented by software, hardware, a combination thereof or any other suitable means (e.g., device, system, process, or component). Additionally, it should be further appreciated that methodologies disclosed throughout this specification are capable of being stored as encoded instructions and/or data on an article of manufacture, for example, a non-transitory computer-readable medium, to facilitate storing, transporting and transferring such methodologies to various devices. Those skilled in the art will understand and appreciate that a method could alternatively be represented as a series of interrelated states or events, such as in a state diagram.

Figure 8:
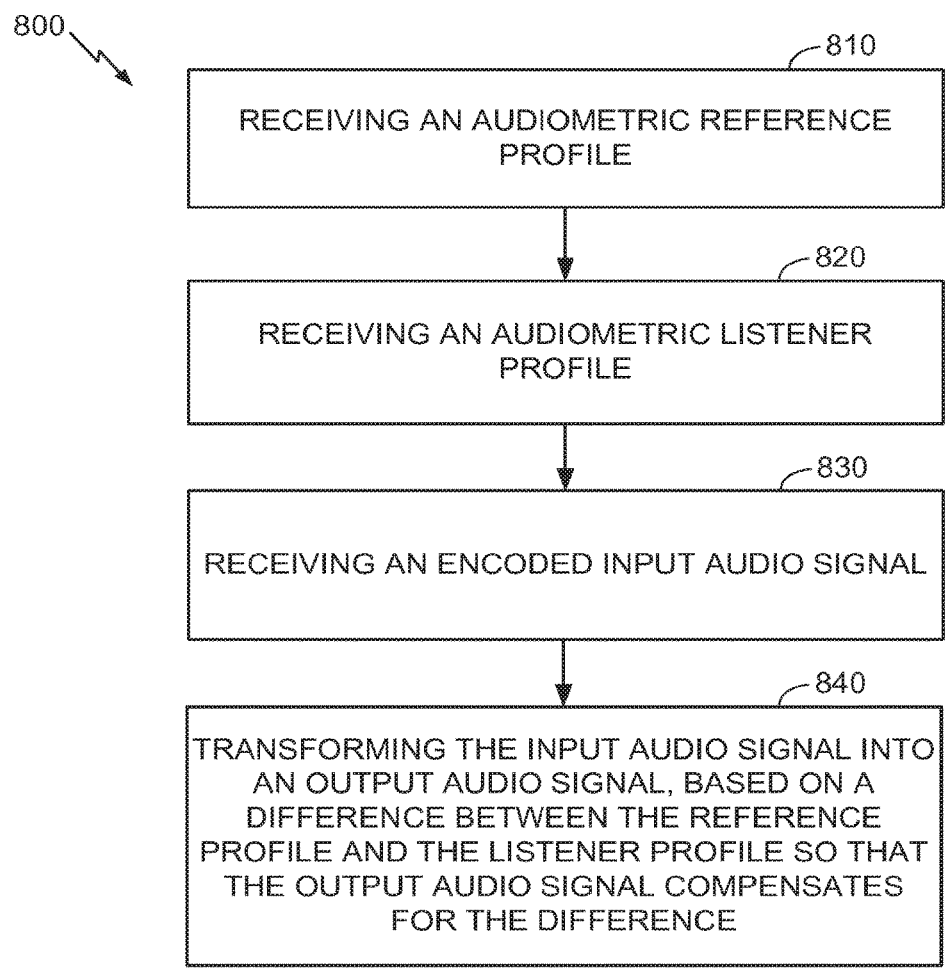
FIGS. 8-11 are diagrams illustrating operations that may be performed by an audio processing apparatus in connection with transforming audio content for subjective fidelity.

As shown in FIG. 8, an audio processing apparatus may perform a method 800 for transforming an audio signal for subjective fidelity to a reference audiometric profile. The method 800 may include at 810, receiving an audiometric reference profile by a signal processor. For example, the signal processor may receive a PWP for a creative producer in audio metadata, or request and receive the reference from a server using a reference identifier obtained from audio metadata.

The method 800 may further include, at 820, the signal processor receiving an audiometric listener profile. For example, the signal processor may retrieve a listener profile from a computer memory, derived from earlier audiometric measurements by an application executing on the same player device as the signal processor.

The method 800 may further include, at 830, receiving an encoded input audio signal. For example, an audio player including the signal processor may read an encoded audio file from a computer readable media, may download the file over a network, or may receive the file via streaming audio.

The method 800 may further include, at 840, the signal processor may perform transforming the input audio signal into an output audio signal, based on a difference between the reference profile and the listener profile so that the output audio signal compensates for the difference. The transformation may be performed digitally on an encoded signal, generating an encoded output signal. In the alternative, the transformation may be performed using an amplifier and/or delay circuit operating on a decoded analog audio signal, under the control of a digital processor. The signal processor may determine the difference between the reference profile and the listener profile, prior to the transforming. The transforming does neither requires not excludes a change in data format.

Figure 9:
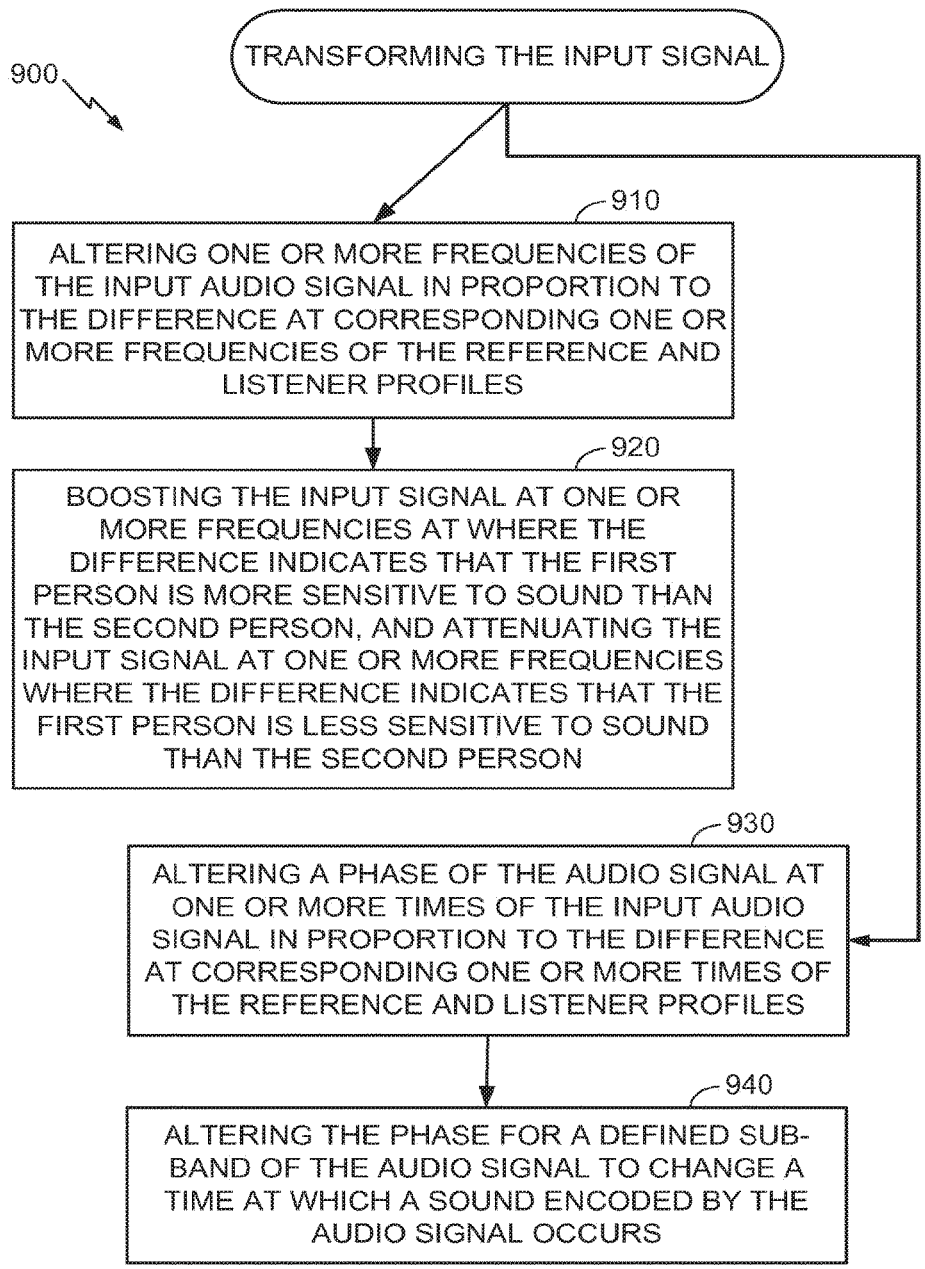
Figure 10:
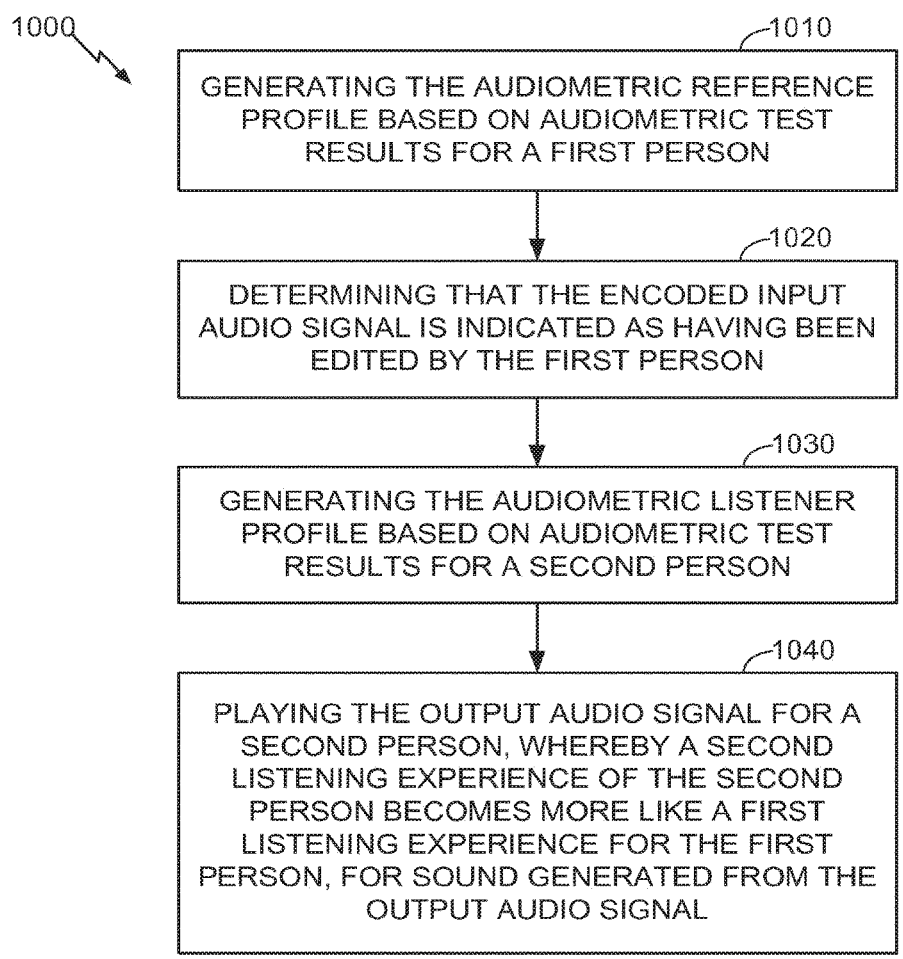
Figure 11:
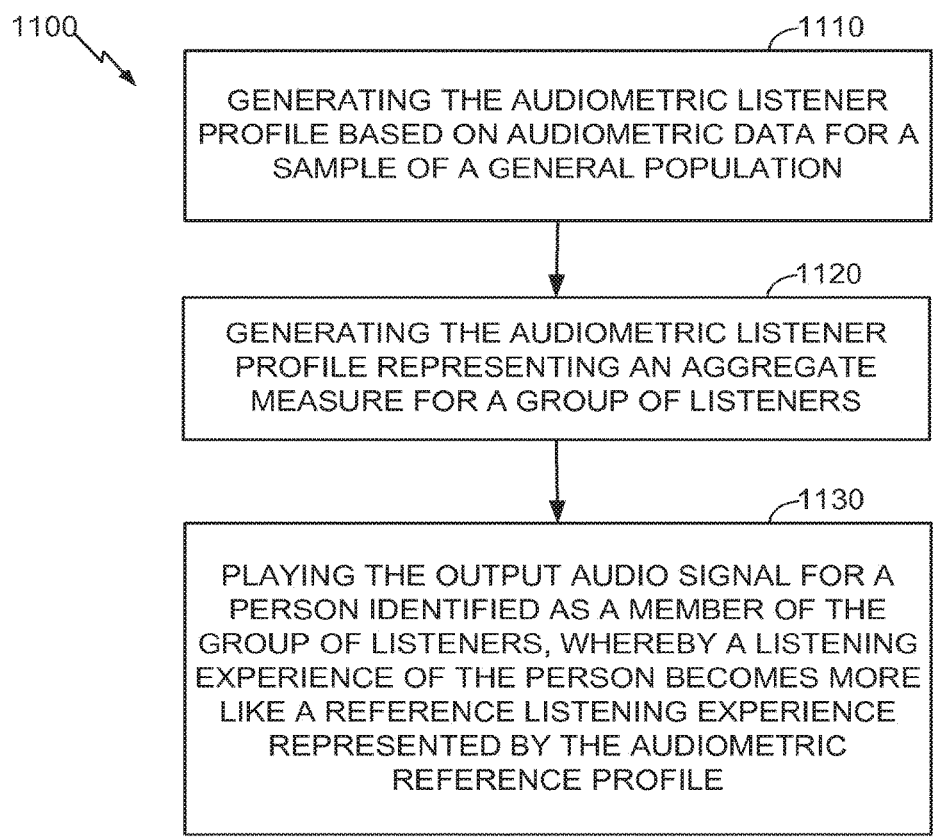

With reference to FIGS. 9-11, several additional operations 900, 1000 and 1100 are depicted for an audio transformation process, which may be performed by a computer server, alone or in combination with an audio player and/or another server. One or more of operations 900, 1000 and 1100 may optionally be performed as part of method 800. The elements of these operations may be performed in any operative order, or may be encompassed by a development algorithm without requiring a particular chronological order of performance. Operations can be independently performed and are not mutually exclusive. Therefore any one of such operations may be performed regardless of whether another downstream or upstream operation is performed. For example, if the method 800 includes at least one of the operations 900, 1000 and 1100, then the method 800 may terminate after the at least one operation, without necessarily having to include any subsequent downstream operation(s) that may be illustrated.

In an aspect, with reference to FIG. 9, the method 800 may further include, at 910, altering one or more frequencies of the input audio signal in proportion to the difference at corresponding one or more frequencies of the reference and listener profiles. For example, the signal processor may calculate a difference at each frequency by interpolating from audiometric measurements at specific discrete frequencies. Then, the signal processor may boost or reduce the gain in proportion to differences at each frequency. For example, the method 800 may further include, at 920, boosting the input signal at one or more frequencies at where the difference indicates that the first person is more sensitive to sound than the second person, and attenuating the input signal at one or more frequencies where the difference indicates that the first person is less sensitive to sound than the second person. Boosting the input signal may include increasing the amplitude of the signal over a selected portion of an applicable audio spectrum at one or more selected frequency bands. Attenuating the input signal may include decreasing the amplitude of the signal over a selected portion of an applicable audio spectrum at one or more selected frequency bands.

In the alternative, or in addition, the method 800 may further include, at 930, altering a phase of the audio signal at one or more times of the input audio signal in proportion to the difference at corresponding one or more times of the reference and listener profiles. For example, the method 800 may further include, at 940, altering the phase for a defined sub-band of the audio signal to change a time at which a sound encoded by the audio signal occurs.

In another aspect, with reference to FIG. 10, the method 800 may further include, at 1010, generating the audiometric reference profile based on audiometric test results for a first person. For example, the first person may be an audio creative producer, whose personal perceptual characteristics determined or influenced the production of the audio product. In such case, the method may include, at 1020, determining that the encoded input audio signal is indicated as having been edited by the first person. Similarly, the method 800 may, at 1030, may include generating the audiometric listener profile based on audiometric test results for a second person. Thus, the method 800 may further include, at 1040, playing the output audio signal for a second person, whereby a second listening experience of the second person becomes more like a first listening experience for the first person, for sound generated from the output audio signal.

In other aspects, with reference to FIG. 11, the method 800 may further include, at 1110, generating the audiometric listener profile based on audiometric data for a sample of a general population. For example, population data may be collected for specific groups for use in cases where individual audiometric profile data is not available. For example, the method 800 may further include, at 1120, generating the audiometric listener profile representing an aggregate measure for a group of listeners. The aggregate measure may include, for example, average or median values. The method 800 may further include, at 1130, playing the output audio signal for a person identified as a member of the group of listeners, whereby a listening experience of the person becomes more like a reference listening experience represented by the audiometric reference profile.

Figure 12:
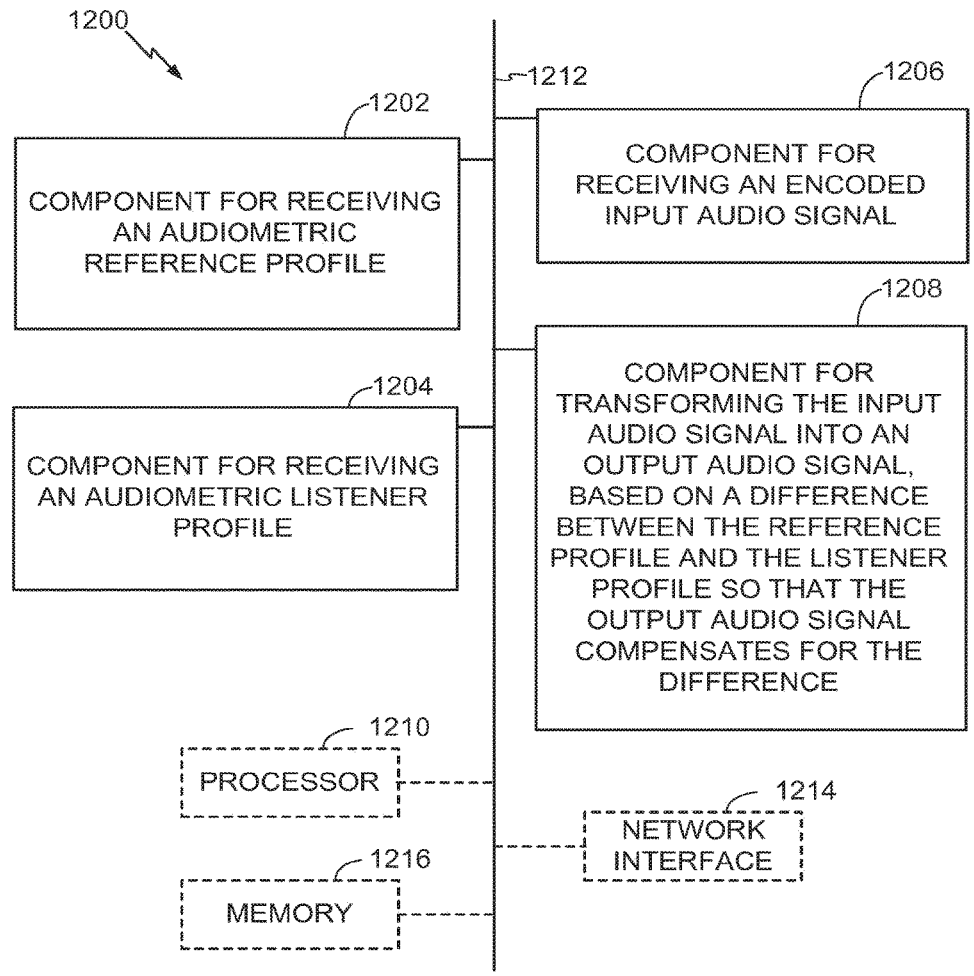
FIG. 12 is a diagram illustrating an audio processing apparatus configured for transforming audio content for subjective fidelity.

With reference to FIG. 12, there is provided an exemplary apparatus 1200 that may be configured as an audio player, or combination of audio player and server, for implementing an audio transformation process for subjective fidelity.

As illustrated, in one embodiment, the apparatus 1200 may include an electrical component or means 1202 for receiving an audiometric reference profile. For example, the electrical component or means 1202 may include at least one control processor 1210 coupled to a memory component 1216. The control processor may operate an algorithm, which may be held as program instructions in the memory component. The algorithm may include, for example, providing a profile identifier obtained from audio metadata to a server, and receiving profile data from the server in response.

The apparatus 1200 may further include an electrical component or module 1204 for receiving an audiometric listener profile. For example, the electrical component or means 1204 may include at least one control processor 1210 coupled to a memory component 1216. The control processor may operate an algorithm, which may be held as program instructions in the memory component. The algorithm may include, for example, obtaining a user identifier from a local memory, and retrieving a stored listener profile from a local data table based on the user identifier. In the alternative, the algorithm may include providing the user identifier to a server, and receiving a listener profile from the server in response to providing the user identifier.

The apparatus 1200 may further include an electrical component or module 1206 for receiving an encoded input audio signal. For example, the electrical component or means 1206 may include at least one control processor 1210 coupled to a memory component 1216. The control processor may operate an algorithm, which may be held as program instructions in the memory component. The algorithm may include, for example, reading an encoded audio file from a computer-readable medium, downloading the file from a server, or receiving a streaming audio fie from the server.

The apparatus 1200 may further include an electrical component or module 1208 for transforming the input audio signal into an output audio signal, based on a difference between the reference profile and the listener profile so that the output audio signal compensates for the difference. For example, the electrical component or means 1208 may include at least one control processor 1210 coupled to a memory component 1216. The control processor may operate an algorithm, which may be held as program instructions in the memory component. The algorithm may include, for example, boosting the input signal at one or more frequencies at where the difference indicates that the first person is more sensitive to sound than the second person, and attenuating the input signal at one or more frequencies where the difference indicates that the first person is less sensitive to sound than the second person. In the alternative, or in addition, the algorithm may include altering a phase of the audio signal at one or more times of the input audio signal in proportion to the difference at corresponding one or more times of the reference and listener profiles.

The apparatus 1200 may include similar electrical components for performing any or all of the additional operations 800-1100 described in connection with FIGS. 8-11, which for illustrative simplicity are not shown in FIG. 12.

In related aspects, the apparatus 1200 may optionally include a processor component 1210 having at least one processor. The processor 1210 may be in operative communication with the components 1202-1208 or similar components via a bus 1212 or similar communication coupling. The processor 1210 may effect initiation and scheduling of the processes or functions performed by electrical components 1202-1208.

In further related aspects, the apparatus 1200 may include a network interface component 1214 enabling communication between a client and a server. The apparatus 1200 may optionally include a component for storing information, such as, for example, a memory device/component 1216. The computer readable medium or the memory component 1216 may be operatively coupled to the other components of the apparatus 1200 via the bus 1212 or the like. The memory component 1216 may be adapted to store computer readable instructions and data for implementing the processes and behavior of the components 1202-1208, and subcomponents thereof, or the processor 1210, or the methods disclosed herein. The memory component 1216 may retain instructions for executing functions associated with the components 1202-1208. While shown as being external to the memory 1216, it is to be understood that the components 1202-1208 can exist within the memory 1216.

It is understood that the specific order or hierarchy of steps in the processes disclosed are merely examples. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, a System On a Chip (SOC), or any other such configuration.

The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A method for processing an audio signal, comprising:
    receiving, by a hardware processor for an audio player device, an encoded audio signal for content comprising at least one of music or an audio track for video content;
    identifying, by the hardware processor based on metadata of the encoded audio signal, a person and an audiometric reference profile for the person representing the person's hearing acuity at multiple frequencies;
    receiving, by the hardware processor based on an identifier for one or more users of the audio player device, an audiometric listener profile for the one or more users representing the one or more users' hearing acuity at multiple frequencies; and
    transforming, by the hardware processor, the encoded audio signal using the hardware processor into an output audio signal, based on an audiometric difference between the audiometric reference profile and the audiometric listener profile so that the output audio signal compensates for the audiometric difference and enables the one or more users to hear the content more like the person identified by the hardware processor based on metadata of the encoded audio signal.

2. The method of claim 1, wherein transforming the input audio signal comprises altering one or more frequencies of the encoded audio signal in proportion to the audiometric difference at corresponding one or more frequencies of the audiometric reference and audiometric listener profiles.

3. The method of claim 1, wherein the identifying comprises at least one of reading an identifier for the person and the audiometric reference profile from the metadata, or requesting at least one of the identifier for the person and the audiometric reference profile from a server based on the metadata.

4. The method of claim 1, wherein the one or more users is a single user, and further comprising generating the audiometric listener profile based on audiometric test results for the single user.

5. The method of claim 1, wherein the transforming further comprises generating the output signal by boosting the input signal at one or more frequencies where the audiometric difference indicates that the person is more sensitive to sound than the one or more users and attenuating the input signal at one or more frequencies where the audiometric difference indicates that the person is less sensitive to sound than the one or more users.

6. The method of claim 5, wherein boosting the input signal comprises increasing an amplitude of the signal over a defined frequency band portion of an audio spectrum.

7. The method of claim 1, wherein the audio player device is also capable of playing video content synchronized to the audio track.

8. The method of claim 1, further comprising providing an indication to the one or more users that the person is a creative producer of the content.

9. The method of claim 1, further comprising generating the audiometric listener profile based on audiometric data for a sample of a general population, so that the audiometric listener profile represents an aggregate measure for the one or more users.

10. The method of claim 1, wherein transforming the input audio signal comprises altering a phase of the audio signal at one or more times of the input audio signal in proportion to the audiometric difference at corresponding one or more times of the audiometric reference and audiometric listener profiles.

11. The method of claim 10, wherein altering the phase is performed for a defined sub-band of the audio signal to change a time at which a sound encoded by the audio signal occurs.

12. The method of claim 1, wherein the audiometric reference profile further characterizes perception time lag of the person at different frequencies, and the audiometric listener profile further characterizes perception time lag of the one or more users at different frequencies.

13. An apparatus, comprising at least one hardware processor coupled to a memory, the memory holding instructions that when executed by the at least one hardware processor causes the apparatus to perform:
    receiving an encoded audio signal for content comprising at least one of music or an audio track for video content;
    identifying based on metadata of the encoded audio signal a person and an audiometric reference profile for the person representing the person's hearing acuity at multiple frequencies;
    receiving based on an identifier for one or more users of the audio player device an audiometric listener profile for the one or more users representing the one or more users' hearing acuity at multiple frequencies; and
    transforming the encoded audio signal into an output audio signal based on an audiometric difference between the audiometric reference profile and the audiometric listener profile so that the output audio signal compensates for the audiometric difference and enables the one or more users to hear the content more like the person identified by the hardware processor based on metadata of the encoded audio signal.

14. The apparatus of claim 13, wherein the memory holds further instructions for transforming the input audio signal at least in part by altering one or more frequencies of the encoded audio signal in proportion to the audiometric difference at corresponding one or more frequencies of the audiometric reference and audiometric listener profiles.

15. The apparatus of claim 13, wherein the memory holds further instructions for the identifying by at least one of reading an identifier for the person and the audiometric reference profile from the metadata, or requesting at least one of the identifier for the person and the audiometric reference profile from a server based on the metadata.

16. The apparatus of claim 13, wherein the one or more users is a single user, and wherein the memory holds further instructions for generating the audiometric listener profile based on audiometric test results for the single user.

17. The apparatus of claim 13, wherein the memory holds further instructions for the transforming at least in part by generating the output signal by boosting the input signal at one or more frequencies where the audiometric difference indicates that the person is more sensitive to sound than the one or more users and attenuating the input signal at one or more frequencies where the audiometric difference indicates that the person is less sensitive to sound than the one or more users.

18. The apparatus of claim 17, wherein the memory holds further instructions for boosting the input signal at least in part by increasing amplitude of the signal over a defined frequency band portion of an audio spectrum.

19. The apparatus of claim 13, wherein the memory holds further instructions for playing video content synchronized to the audio track.

20. The apparatus of claim 13, wherein the memory holds further instructions for providing an indication to the one or more users that the person is a creative producer of the content.

21. The apparatus of claim 13, wherein the memory holds further instructions for generating the audiometric listener profile based on audiometric data for a sample of a general population, so that the audiometric listener profile represents an aggregate measure for the one or more users.

22. The apparatus of claim 13, wherein the memory holds further instructions for transforming the input audio signal at least in part by altering a phase of the audio signal at one or more times of the input audio signal in proportion to the audiometric difference at corresponding one or more times of the audiometric reference and audiometric listener profiles.

23. The apparatus of claim 22, wherein the memory holds further instructions for altering the phase for a defined sub-band of the audio signal to change a time at which a sound encoded by the audio signal occurs.

24. The apparatus of claim 13, wherein the memory holds further instructions for receiving the audiometric reference profile further characterizing perception time lag of the person at different frequencies, and the audiometric listener profile further characterizing perception time lag of the one or more users at different frequencies.

25. A non-transitory computer-readable medium comprising encoded instructions, that when executed by a processor, cause a signal processing device to perform the operations of:
    receiving an encoded audio signal for content comprising at least one of music or an audio track for video content;
    identifying based on metadata of the encoded audio signal a person and an audiometric reference profile for the person representing the person's hearing acuity at multiple frequencies;
    receiving based on an identifier for one or more users of the audio player device an audiometric listener profile for the one or more users representing the one or more users' hearing acuity at multiple frequencies; and
    transforming the encoded audio signal into an output audio signal based on an audiometric difference between the audiometric reference profile and the audiometric listener profile so that the output audio signal compensates for the audiometric difference and enables the one or more users to hear the content more like the person identified by the hardware processor based on metadata of the encoded audio signal.

* * * * *